(12) United States Patent
Satou et al.

(10) Patent No.: US 8,724,288 B2
(45) Date of Patent: May 13, 2014

(54) ELECTROSTATIC CHUCK AND VACUUM PROCESSING APPARATUS

(75) Inventors: Tadayuki Satou, Susono (JP); Tadashi Oka, Susono (JP); Kyuzo Nakamura, Chigasaki (JP)

(73) Assignee: ULVAC, Inc., Kanagawa (JP)

( * ) Notice: Subject to any disclaimer, the term of this patent is extended or adjusted under 35 U.S.C. 154(b) by 517 days.

(21) Appl. No.: 13/057,786

(22) PCT Filed: Aug. 17, 2009

(86) PCT No.: PCT/JP2009/064415
§ 371 (c)(1),
(2), (4) Date: Feb. 23, 2011

(87) PCT Pub. No.: WO2010/024146
PCT Pub. Date: Mar. 4, 2010

(65) Prior Publication Data
US 2011/0132259 A1 Jun. 9, 2011

(30) Foreign Application Priority Data
Aug. 27, 2008 (JP) ................................ 2008-218404

(51) Int. Cl.
*H01L 21/687* (2006.01)
*B05C 13/00* (2006.01)
(52) U.S. Cl.
USPC ........ 361/234; 118/620; 118/723 E; 279/128; 156/345.45
(58) Field of Classification Search
USPC .... 118/620, 723 R, 723 E, 723 VE; 361/234; 156/345.41, 345.42, 345.43, 345.44, 156/345.45; 279/128
See application file for complete search history.

(56) References Cited

U.S. PATENT DOCUMENTS 5,636,098 A * 6/1997 Salfelder et al. .............. 361/234
5,870,271 A * 2/1999 Herchen ........................ 361/234
(Continued)

FOREIGN PATENT DOCUMENTS

JP 01-241839 A 9/1989
JP 09-289201 A 11/1997
(Continued)

OTHER PUBLICATIONS

Machine Generated English Translation of JP 2004-253718 published Sep. 9, 2004.*
Office Action issued in Singapore Patent App. No. 201100941-02 (Dec. 17, 2012).
International Search Report for PCT Patent App. No. PCT/JP2009/064415 (Sep. 8, 2009).

*Primary Examiner* — Sylvia R MacArthur
(74) *Attorney, Agent, or Firm* — Cermak Nakajima LLP; Tomoko Nakajima

(57) ABSTRACT

An electrostatic chuck is provided which is arranged that, at the time of performing processing treatments of irradiating light to a to-be-processed substrate while holding the translucent to-be-processed substrate, the to-be-processed substrate can surely be held even in case the attraction force lowers due to photoelectric effect. An electrostatic chuck has a chuck plate made of a dielectric material, and a first electrode and a second electrode, both electrodes being disposed in the chuck plate. A voltage is applied between the first and the second electrodes to thereby attract the to-be-processed substrate S to the surface of the chuck plate. The electrostatic chuck has, on part of the surface of the chuck plate, a substrate holding section 64 which is made of an adhesive sheet and the like having an adhesive force with respect to the to-be-processed substrate.

4 Claims, 2 Drawing Sheets

(56) References Cited

U.S. PATENT DOCUMENTS

| | | | |
|---|---|---|---|
| 7,849,815 B2 * | 12/2010 | Osada et al. | 118/723 E |
| 2006/0268491 A1 | 11/2006 | Itakura et al. | |
| 2007/0283891 A1 | 12/2007 | Okayama | |
| 2011/0132259 A1 * | 6/2011 | Satou et al. | 118/620 |

FOREIGN PATENT DOCUMENTS

| | | |
|---|---|---|
| JP | 2004-031502 A | 1/2004 |
| JP | 2004-172487 A | 6/2004 |
| JP | 2004-253718 A | 9/2004 |
| JP | 2004-309594 A | 11/2004 |

* cited by examiner

ELECTROSTATIC CHUCK AND VACUUM PROCESSING APPARATUS

This application is a national phase entry under 35 U.S.C. §371 of PCT Patent Application No. PCT/JP2009/064415, filed on Aug. 17, 2009, which claims priority under 35 U.S.C. §119 to Japanese Patent Application No. 2008-218404, filed Aug. 27, 2008, both of which are incorporated by reference.

TECHNICAL FIELD

The present invention relates to an electrostatic chuck which is suitable for holding a translucent substrate to be processed (hereinafter referred to as a to-be-processed substrate), e.g., mainly a glass substrate, a sapphire substrate, and the like. The invention also relates to a vacuum processing apparatus using this electrostatic chuck.

BACKGROUND ART

As the electrostatic chuck, there is conventionally known one which is provided with: a chuck plate made of a dielectric material; and a first electrode and a second electrode, both electrodes being disposed in the chuck plate such that a voltage is applied between the first and the second electrodes to thereby attract a to-be-processed substrate to the surface of the chuck plate (see, e.g., patent document 1). In case the to-be-processed substrate is an insulating substrate, the to-be-processed substrate gets attracted to the surface of the chuck plate due to a gradient force that is generated by applying a voltage between the first and the second electrodes. In case the to-be-processed substrate is a non-insulating substrate, the to-be-processed substrate gets attracted to the surface of the chuck plate due to Coulomb force that is generated by applying a voltage between the first and the second electrodes.

By the way, if a substrate having translucency such as glass substrate, sapphire substrate and the like is subjected to plasma etching processing or plasma CVD processing, light from the plasma is irradiated to the to-be-processed substrate, and this light is incident into the chuck plate through the to-be-processed substrate. Then, part of the dielectric material that forms the chuck plate becomes electrically conductive through photoelectric effect, resulting in lowering in the attraction (or suction) force.

However, there has conventionally been taken no measures against this kind of lowering in attraction force. The lowered attraction force has become a factor in the occurrence of a positional deviation of the to-be-processed substrate on the electrostatic chuck.

PRIOR ART DOCUMENT

Patent Document

Patent Document 1: JP-A-2004-31502

SUMMARY OF THE INVENTION

Problems to be Solved by the Invention

In view of the above points, this invention has a problem of providing an electrostatic chuck which is arranged to positively hold a to-be-processed substrate even if the attraction force may have decreased due to photoelectric effect, and also has a problem of providing a vacuum processing apparatus using the above-mentioned electrostatic chuck.

Means for Solving the Problems

In order to solve the above-mentioned problems, an electrostatic chuck of this invention comprises: a chuck plate made of a dielectric material; and a first electrode and a second electrode. Both the electrodes are disposed in the chuck plate such that a voltage is applied between the first and the second electrodes to thereby attract a to-be-processed substrate to a surface of the chuck plate. The electrostatic chuck further comprises, on part of the surface of the chuck plate, a substrate holding section having an adhesive force with respect to the to-be-processed substrate.

A vacuum processing apparatus according to this invention comprises: a vacuum processing chamber; and an electrostatic chuck disposed inside the vacuum processing chamber such that a translucent to-be-processed substrate is held by the electrostatic chuck to thereby subject the to-be-processed substrate to processing treatments accompanied by irradiation of light thereto. As the electrostatic chuck, the one as described hereinabove is used.

According to the electrostatic chuck of this invention, even if the attraction force of the electrostatic chuck lowers due to photoelectric effect, the to-be-processed substrate can surely be held on the surface of a main body of the electrostatic chuck due to the adhesive force of the substrate holding section. Therefore, in the vacuum processing apparatus of this invention, despite the fact that the processing treatments are accompanied by irradiation of light to the translucent to-be-processed substrate, the to-be-processed substrate can be prevented from positionally deviating on the electrostatic chuck.

Further, according to the electrostatic chuck of this invention, preferably the surface of the substrate holding section, in a free state thereof, is projected out of the surface of the chuck plate by a predetermined height and, when the to-be-processed substrate is attracted to the surface of the chuck plate by applying a voltage between the first and the second electrodes, the substrate holding section is compressed such that the surface of the substrate holding section becomes flush with the surface of the chuck plate. According to this arrangement, as a result of compression of the substrate holding section at the time of attraction of the to-be-processed substrate, the substrate holding section is strongly urged against the to-be-processed substrate. The to-be-processed substrate can thus be surely adhered to the substrate holding section.

EMBODIMENTS FOR CARRYING OUT THE INVENTION

Figure 1:
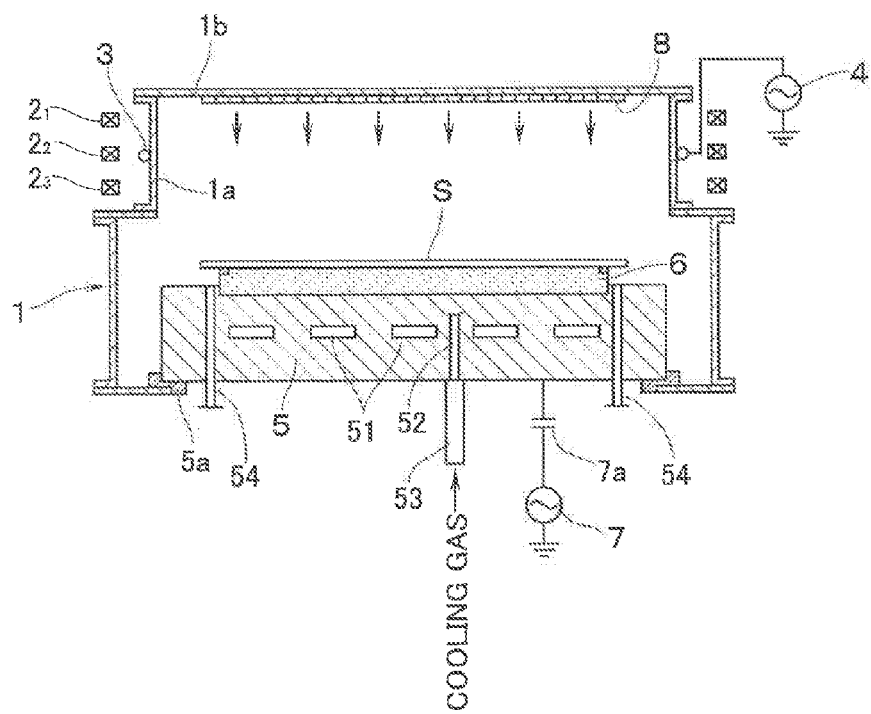
FIG. 1 is a schematic cross section showing a vacuum processing apparatus according to one embodiment of this invention.

FIG. 1 shows a vacuum processing apparatus for performing plasma etching (dry etching) processing on a to-be-processed substrate S having translucency such as a glass substrate, a sapphire substrate, and the like. This vacuum processing apparatus is provided with a vacuum processing chamber 1 the inside of which is evacuated by a vacuum pump (not illustrated). An upper part of the vacuum processing chamber 1 is formed of a side wall 1a of a dielectric material. By means of three magnetic field coils $2_1$, $2_2$, $2_3$ disposed along an outside of this side wall 1a, there are formed annular magnetic neutral lines inside the chamber. Between the intermediate magnetic field coil $2_2$ and the side wall 1a of dielectric material, there is disposed a high-frequency antenna coil 3 for plasma generation. The high-frequency antenna coil 3 is connected to a high-frequency power supply 4 and alternating electric field is applied along the above-mentioned magnetic neutral lines, whereby discharge plasma is generated.

On a lower part of the vacuum processing chamber 1, there is mounted a substrate electrode 5 via an insulating material 5a. To the top of this substrate electrode 5 there is fixed an electrostatic chuck 6 which holds and cools the to-be-processed substrate S. The substrate electrode 5 is connected to a high-frequency power supply 7 which applies high-frequency bias power to the substrate electrode through a blocking condenser 7a. A top plate 1b of the vacuum processing chamber 1 is fixed to an upper flange of the side wall 1a of dielectric material in a hermetically sealed manner. An opposite electrode is constituted by the top plate 1b which becomes potentially floating. On a lower surface of the top plate 1b there is provided a gas introduction part 8 which introduces an etching gas into the vacuum processing chamber 1. Then, the etching gas is converted to plasma so as to perform a predetermined etching processing to the to-be-processed substrate S which is placed on the electrostatic chuck 6.

The substrate electrode 5 has formed therein a passage 51 for circulating therethrough cooling water, and a gas flow passage 52 for causing a cooling gas (e.g., helium gas) to flow in order to cool the to-be-processed substrate S on the electrostatic chuck 6. The cooling gas is supplied from outside the apparatus through an introduction pipe 53 which is connected to a lower surface of the substrate electrode 5.

Figure 2:
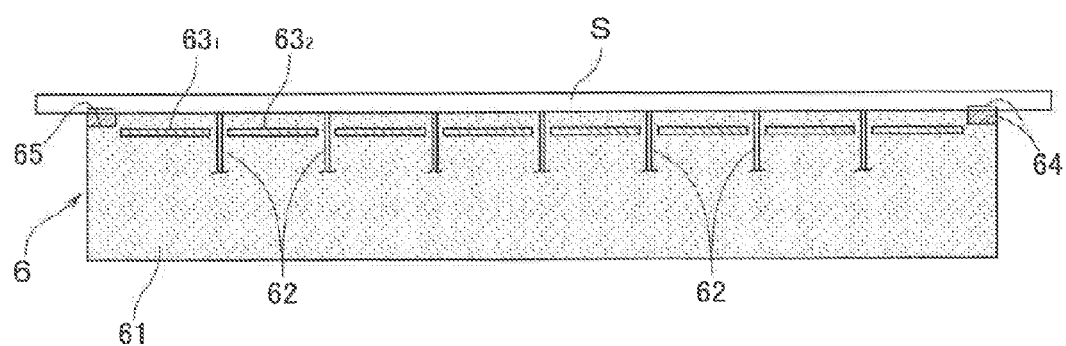
FIG. 2 is an enlarged sectional view of an electrostatic chuck which is disposed inside the vacuum processing apparatus of FIG. 1.
Figure 3:
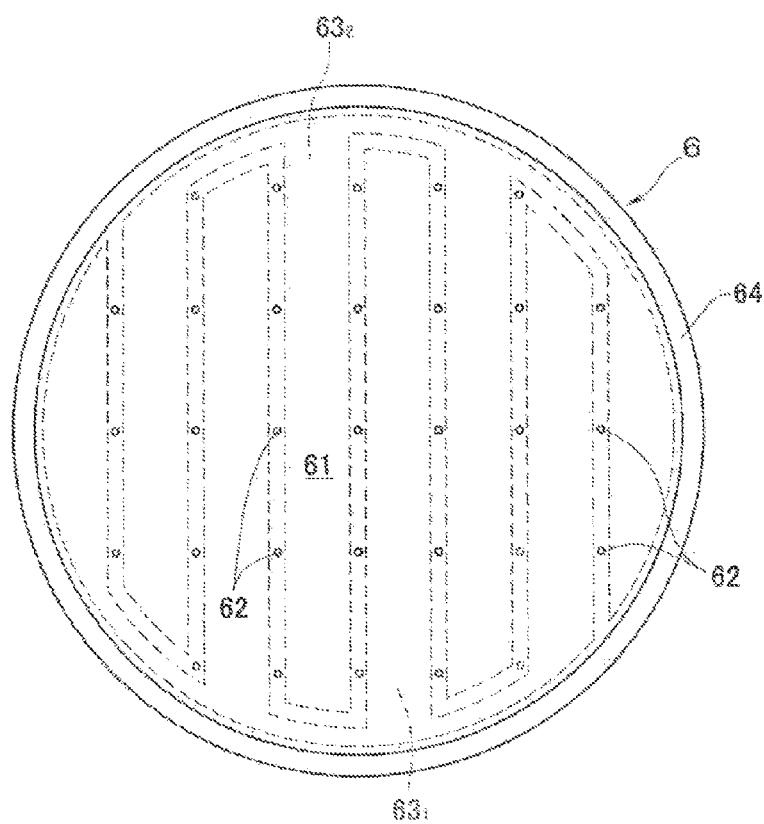
FIG. 3 is a plan view of the electrostatic chuck of FIG. 2.

The electrostatic chuck 6 has a chuck plate 61 formed by using, e.g., a ceramic material which is a dielectric material. With reference to FIGS. 2 and 3, the chuck plate 61 has formed therein a plurality of gas discharge holes 62 which discharge the cooling gas from the gas flow passage 52 toward a rear surface of the to-be-processed substrate S.

The chuck plate 61 has buried therein a first electrode $63_1$ and a second electrode $63_2$. The first electrode $63_1$ and the second electrode $63_2$ are formed into the shape of comb's teeth and are disposed so that the teeth come into engagement with each other in a manner to be free from contact with each other. By applying a DC voltage between the first electrode $63_1$ and the second electrode $63_2$ from a power supply (not illustrated), the to-be-processed substrate S is arranged to be attracted to the surface of the chuck plate 61. A glass substrate and a sapphire substrate are insulating substrates, and are attracted to the chuck plate 61 by the gradient force that is generated by the application of a voltage between both the first and the second electrodes $63_1$, $63_2$.

At the time of performing plasma etching processing, the light from the plasma is irradiated onto the to-be-processed substrate S, and this light will be incident into the chuck plate 61 through the to-be-processed substrate S. Then, at the surface layer portion of the chuck plate 61, part of the dielectric material which forms the chuck plate 61 will become electrically conductive through photoelectric effect. There is accordingly a case in which the attraction force lowers in the course of the etching processing.

As a solution, the chuck plate 61 is provided on a part of the surface thereof with a substrate holding section 64 which has an adhesive force with respect to the to-be-processed substrate S. In this embodiment, the chuck plate 61 has formed on the peripheral surface portion thereof a counter-bored portion 65. An adhesive tape attached to the counter-bored portion 65 constitutes the substrate holding section 64. The surface of the substrate holding section 64, in a free state thereof, is projected, as shown by an imaginary line in FIG. 2, from the surface of the chuck plate 61 by a predetermined height (e.g., 100 μm).

According to this arrangement, when the to-be-processed substrate S is attracted to the surface of the chuck plate 61 by applying a voltage between the first and the second electrodes $63_1$, $63_2$, the surface of the substrate holding section 64 will be compressed so that the surface of the substrate holding section 64 becomes flush with the surface of the chuck plate 61. Due to the compression by the to-be-processed substrate S, the substrate holding section 64 will be strongly urged or pressed against the to-be-processed substrate S. The to-be-processed substrate S will thus be surely adhered to the substrate holding section 64. As a result, even if the attraction force of the electrostatic chuck 6 is lowered due to photoelectric effect in the course of the etching processing, the to-be-processed substrate S can surely be held, by the adhesive force of the substrate holding section 64, to the surface of the chuck plate 61 without giving rise to positional deviation.

The outside diameter of the chuck plate 61 is slightly smaller than the outside diameter of the to-be-processed substrate S and, therefore, the peripheral portion of the to-be-processed substrate S will overhang beyond the outside of the chuck plate 61. In a manner to face the rear surface of that peripheral portion of the to-be-processed substrate S which overhangs beyond the chuck plate 6, the substrate electrode 5 has inserted therethrough a plurality of lift pins 54 in a manner to be moveable up and down. After having finished the etching processing, the lift pins 54 are moved up by a driving source (not illustrated) to peel the to-be-processed substrate S off from the substrate holding section 64. The to-be-processed substrate S is thus lifted above the electrostatic chuck 6 so that it can be handed over to a transfer robot (not illustrated) in a state as it is.

A description has so far been made of an embodiment of this invention with reference to the drawings. This invention is, however, not limited thereto. For example, in the above-mentioned embodiment, the substrate holding section 64 was disposed in a front peripheral surface portion of the chuck plate 61. The substrate holding section may alternatively be disposed by distributing it in a plurality of portions on the surface of the chuck plate 61. In addition, the electrostatic chuck 6 in the above-mentioned embodiment is to hold a single piece of to-be-processed substrate S on the chuck plate 61. This invention may also be applied to an electrostatic chuck having the following construction, that is: a plurality of island-like chuck portions are disposed in a projecting manner on the upper surface of the chuck plate; and electrodes are buried in each of the chuck portions so that a to-be-processed substrate can be held in each of the chuck portions, on condition that each of the chuck portions is provided, on a part of the surface of each of the chuck portions, with a substrate holding section.

In addition, the above-mentioned embodiment is an application of this invention to a vacuum processing apparatus in which plasma etching processing is performed. This invention may also be widely applied to a vacuum processing apparatus in which processing is performed of irradiating light to a translucent substrate, such as a plasma CVD apparatus, and an apparatus having a lamp for heating a to-be-processed substrate.

DESCRIPTION OF REFERENCE NUMERALS AND CHARACTERS

S to-be-processed substrate
1 vacuum processing chamber
2 electrostatic chuck
61 chuck plate
63$_1$ first electrode
63$_2$ second electrode
64 substrate holding section

What is claimed is:

1. An electrostatic chuck comprising:
a chuck plate made of a dielectric material; and
a first electrode and a second electrode, both the electrodes being disposed in the chuck plate such that a voltage is applied between the first and the second electrodes to thereby attract a to-be-processed substrate to a surface of the chuck plate,
wherein the electrostatic chuck further comprises, on part of the surface of the chuck plate, a substrate holding section having an adhesive force with respect to the to-be-processed substrate,
wherein a surface of the substrate holding section, in a free state thereof, is projected out of the surface of the chuck plate by a predetermined height and, when the to-be-processed substrate is attracted to the surface of the chuck plate by applying a voltage between the first and the second electrodes, the substrate holding section is compressed such that the surface of the substrate holding section becomes flush with the surface of the chuck plate,
wherein the chuck plate has a counter-bored portion only on a peripheral surface portion of the chuck plate,
wherein the substrate holding section having the adhesive force is provided on the counter-bored portion and is an independent item from the chuck plate and a substrate so that a surface of the substrate holding section in a free state is projected out of the surface of the chuck plate by a predetermined height, and
wherein the substrate holding section is an adhesive tape.

2. A vacuum processing apparatus comprising:
a vacuum processing chamber; and
an electrostatic chuck disposed inside the vacuum processing chamber such that a translucent to-be-processed substrate is held by the electrostatic chuck to thereby subject the to-be-processed substrate to processing treatments accompanied by irradiation of light thereto,
wherein, as the electrostatic chuck, the electrostatic chuck according to claim 1 is used.

3. A vacuum processing apparatus comprising:
a vacuum processing chamber; and
an electrostatic chuck disposed inside the vacuum processing chamber such that a translucent to-be-processed substrate is held by the electrostatic chuck to thereby subject the to-be-processed substrate to processing treatments accompanied by irradiation of light thereto,
wherein, as the electrostatic chuck, the electrostatic chuck according to claim 1 is used.

4. The electrostatic chuck according to claim 1, wherein the substrate holding section having the adhesive force is provided only on a peripheral surface portion of the chuck plate.

* * * * *